United States Patent [19]

Shinonara

[11] Patent Number: 5,101,122
[45] Date of Patent: Mar. 31, 1992

[54] PROGRAMMABLE LOGIC DEVICE
[75] Inventor: Hirofumi Shinonara, Hyogo, Japan
[73] Assignee: Mitsubishi Denki Kabushiki Kaisha, Tokyo, Japan
[21] Appl. No.: 616,276
[22] Filed: Nov. 20, 1990
[30] Foreign Application Priority Data Feb. 6, 1990 [JP] Japan .................................. 2-26603

[51] Int. Cl.$^5$ ........................................ H03R 19/177
[52] U.S. Cl. .................... 307/465; 307/443; 307/468; 307/481; 307/594
[58] Field of Search ............ 307/443, 452, 465, 465.1, 307/468–469, 481, 240, 594, 601, 605; 340/825.83

[56] References Cited

U.S. PATENT DOCUMENTS

| | | | |
|---|---|---|---|
| 4,611,133 | 9/1986 | Peterson et al. | 307/465 |
| 4,697,105 | 9/1987 | Moy | 307/443 X |
| 4,760,290 | 7/1988 | Martinez | 367/481 X |
| 4,959,646 | 9/1990 | Podkawa et al. | 340/825.83 |
| 4,990,801 | 2/1991 | Caesar et al. | 307/465 X |

OTHER PUBLICATIONS

Kluga, "Clocked PLA with Dummy Circuit Forming Clock Pulse for Inter-Array Driver with Worst-Case Delay", *IBM T.D.B.*, vol. 24, No. 6, Nov. 1981, p. 3103 (307/465).
"Principles of CMOS VLSI Design: A System Perspective", by Weste et al., p. 322, 1985.

Tietze; Schenk: Halbleiter-Schaltungstechnik, 6th Edition, Springer-Verlag, Berlin 1983, pp. 276–277.
Elektronic, Issue No. 23, 1982, pp. 1-24.

*Primary Examiner*—David Hudspeth
*Attorney, Agent, or Firm*—Lowe, Price, LeBlanc & Becker

[57] ABSTRACT

A programmable logic device includes AND-plane and OR-plane. The AND-plane includes first input signal lines (B1, B1, B2, B2) having input signals transmitted, product term lines (A1-A4), a first precharge circuit (3b), a clock generator (15) for generating a first clock signal, and a dummy circuit (7b) having dummy output lines which have the precharge finished in response to the first clock signal and the discharge made at a speed less than the slowest discharge speed of the product term lines. The OR-plane includes second input signal lines (AB1-AB4), sum term lines (01-04), dummy input lines (ADB1, ADB2) to be charged at a speed less than the lowest charge speed of the second input signal lines, and second precharge circuit (5b). The programmable logic device further includes a second clock generator (8c; 8d; 8e) for generating a second clock signal and circuitry (16) for generating a third clock signal in response to the external clock, and circuitry (L1-L4) for latching the signal potential on the sum term lines so as to derive the output signals. The respective two sum lines are arranged in a pair, and one discharge signal line (CD1-CD4) is provided to the pair.

24 Claims, 7 Drawing Sheets

PROGRAMMABLE LOGIC DEVICE

BACKGROUND OF THE INVENTION

1. Field of the Invention

The present invention relates to programmable logic devices, and more particularly to a synchronous type programmable logic device which performs precharge of product term lines and sum term lines, decision and evaluation of outputs of the product term lines and the sum term lines synchronizing with clock signals from the outside.

2. Description of the Background Art

In recent years, in order to facilitate design and high integration of logic circuits, logic devices called a programmable logic array (PLA) and a programmable logic device (PLD) are widely used. The programmable logic device utilizes the fact that the combination logic can be expressed by product-sum type logics, and is provided with AND-plane which outputs the logical products of any input signals among a plurality of input signals to the product term lines, and with OR-plane which takes the logical sum of outputs of any product term lines among the product term lines of the AND-plane.

Both the AND-plane and the OR-plane have transistor arrays in similar manner to the read only memory (ROM), and the transistor array pattern is programmed, whereby prescribed logic function can be obtained. The program of logic realized by the programmable logic device is performed with presence/absence of a transistor or presence/absence of connection to transistors arranged in array form corresponding to the logic "1" or "0".

As one of such programmable logic device, there is a synchronous type programmable logic device applying the logic operation processing to input signals in response to an external clock.

FIG. 1 is a diagram showing an example of programmable logic devices in the prior art disclosed, for example, in Tomizawa et al. translation supervision, "Principles of CMOSVLSI DESIGN A Systems Perspective" page 332, published in 1988 by Maruzen Co., Ltd.

Referring to FIG. 1, the programmable logic device comprises an AND-plane 2a applying the logic product operation to inputs from an input buffer 1 for outputting, an OR-plane 4a receiving the logic product (product term line) outputs A1 through A4 from the AND-plane 2a and applying the logic sum operation processing thereto, and an output buffer 6 for latching the logic sum (sum term line) outputs 01–04 from the OR-plane 4a for outputting. In the constitution shown in FIG. 1, constitution of logic circuit of two inputs and four outputs is shown as an example.

The input buffer 1 comprises an input buffer circuit 1a receiving input signals IN1 from an outside and generating non-inverted signals and inverted signals, and an input buffer circuit 1b receiving input signals IN2 supplied from the outside and deriving non-inverted signals and inverted signals. The input buffer circuit 1a comprises an inverter IV10 receiving the input signals IN1 and transmitting the inverted signals to a complementary internal data input line B1, and an inverter IV11 receiving outputs of the inverter IV10 and transmitting the inverted signal to an internal data input line $\overline{B1}$. The input buffer circuit 1b comprises an inverter IV20 receiving input signals IN2 from the outside and transmitting the inverted signal to a complementary internal data input line B12, and an inverter IV21 receiving outputs of the inverter IV20 and transmitting the inverted signal onto an internal data input line $\overline{B2}$.

The AND-plane 2a comprises product term lines A1, A2 A3 and A4 arranged in directions orthogonal to the data input lines B1, $\overline{B1}$, B2, $\overline{B2}$, and transistor elements T21–T27 arranged selectively to the intersection points between the data input lines B1, $\overline{B1}$, B2, $\overline{B2}$ and the product term lines (data output lines) A1 to A4.

Potential supply lines D21–D24 for transmitting the reference potential in parallel to each of the potential term lines A1–A4. Each of the transistor elements T21–T27 comprises an insulation gate type field effect transistor, and is rendered conductive in response to the signal potential on the associated input signal line so as to connect the corresponding product term line and the corresponding potential supply line (D2i; i=1–4).

The OR-plane 4a have the product term lines A1–A4 from the AND-plane 2a arranged extending to its inside to receive the signal potentials on the product term lines A1–A4 as its input signals. The OR-plane 4a is further have, arranged to the direction intersecting the product term lines A1–A4, sum term lines 01–04 for taking the logical sum of any signal potentials on the product term lines A1–A4 and outputting it, and have transistor elements T41–T46 arranged selectively on the intersections between the product term lines A1–A4 and the sum term lines 01–04. Second potential supply lines D41–D44 are installed so as to transmit a reference potential (ground potential) in parallel to the sum term lines 01–04. Each of the transistor elements D41–D46 is rendered conductive in response to the signal potential on the corresponding product term line Ai (i=1–4) so as to connect the corresponding sum term line $\overline{Oj}$ (j=1-4) to the second potential supply line D4j.

An output buffer 6 is provided corresponding to each of the sum term lines 01–04, and comprises output circuits 6a–6d for latching the signal potential on the corresponding sum term line $\overline{Oi}$ and outputting it. Each of the output buffer circuits 6a–6d comprises a latch circuit Li for latching or passing the signal potential on the corresponding sum term line $\overline{Oi}$ in response to a clock signal CLK2 from the outside, and an inverter IV for inverting the output of the latch circuit Li and outputting the output data OUTi. That is, the output buffer circuit 6a comprises a latch circuit L1 for latching or passing the signal potential on the sum term line 01 in response to the clock signal CLK2, and an inverter IV30 for inverting the output of the latch circuit L1 and outputting an output data OUT1. The output buffer circuit 6b comprises a latch circuit L2 for latching the signal potential on the sum term line 02 in response to the clock signal CLK2, and an inverter IV40 for inverting the output of the latch circuit L2 and deriving an output data OUT2. The output buffer circuit 6c comprises a latch circuit L3 for latching the signal potential on the sum term line 03 in response to the clock signal CLK2, and an inverter IV50 for inverting an output of the latch circuit L3 and deriving an output signal OUT3. The output buffer circuit 6d comprises a latch circuit L4 for latching the signal potential on the sum term line 04 in response to the clock signal CLK2, and an inverter IV60 for inverting the output of the latch circuit L4 and deriving an output signal OUT4.

In order to precharge the product term line Ai of the AND-plane 2a to a prescribed potential, a precharge circuit 3a is installed. The precharge circuit 3a comprises p-channel MIS (insulation gate type filed effect) transistors PT21-PT24 for receiving the clock signal CLK1 supplied from the outside through the inverter IV1 at its gate and precharging each of the product term potential Vdd), and n-channel MIS transistors NT21-NT24 being rendered conductive in response to the inverted clock signal from the inverter IV1 and connecting each of the potential supply lines D21-D24 to the second reference potential (ground potential) Vss.

In order to precharge each of the sum term lines 01-04 of the OR-plane 4a to a precharge potential, a second precharge circuit 5a is installed. The precharge circuit a comprises p-channel MIS transistors PT51-PT54 being rendered conductive in response to the clock signal CLKOR the reference potential Vdd, and n-channel MIS transistors NT51-NT54 being rendered conductive in response to the clock signal CLKOR and precharging each of the potential supply lines D41-D44 to the ground potential Vss.

In order to generate the clock signal CLKOR controlling the operation timing of the precharge circuit 5a, a dummy AND circuit 7a is installed. The dummy AND circuit 7a comprises a dummy product term line AD and a reference potential supply line D70, transistor elements T73, T74, T75 and T76 arranged on the intersections between the dummy product term line AD and the internal data input lines B1, B1, B2, B2, p-channel MIS transistor PT71 precharging the dummy product term line AD to the power source potential Vdd in response to the inverted clock signal CLK1 from the inverter IV1, and n-channel MIS transistor NT72 being rendered conductive in response to the inverted clock signal CLK1 and coupling the potential supply line D70 with the ground Vss.

The number of the transistors connected to the dummy product term line AD of the dummy AND circuit 7a is equal to the maximum number among the number that the transistors connected to the product term lines A1-A4 can be turned on simultaneously. That is, since the non-inverted signal and the inverted-signal are derived from the input buffer circuits 1a, 1b respectively in the constitution shown in FIG. 1, the number of the transistors capable of being connected to one product term line becomes four at most. Consequently, four transistor elements are connected to the dummy product term line AD. The output AD of the dummy AND circuit 7a is used as the clock signal CLKOR controlling the precharge operation of the precharge circuit 5a through the inverter 8a.

The precharge circuit 3a and the AND-plane 2a constitute a synchronous type NOR circuit using the input signals IN1, IN2 supplied to the input buffer 1 as input, in accordance with the arrangement of the transistor elements T21-T27. Also the OR-plane 4a and the precharge circuit 5a constitute a synchronous type NOR circuit using the signal potentials on the product term lines A1-A4 from the AND-plane 2a as input, in accordance with the arrangement of the transistor elements T41-T46. Next, the operation will be described referring to FIG. 2 being its operation waveform diagram.

In the arrangement of AND plane 2a and OR plane 4a of FIG. 1, the following logical operations are performed, where a signal line and a signal thereon have the same characters denoted:

A1=IN1+IN2,

A2=IN1+IN2,

A3=IN1+IN2,

A4=IN1=IN2,

01=A1,

02=A1+A2+A3

03=A2,

04=A4.

The clock signal CLK1 and the clock signal CLK2 do not become "H" simultaneously and do not overlap with each other, and constitute the non-overlapping two-phase clocks. When the clock signal CLK1 is at "H", the inverted clock signal CLK1 from the inverter IV1 becomes "L". Therefore the p-channel MIS transistors (hereinafter referred to simply as "pMIS transistors") PT21-PT24 included in the precharge circuit 3a are turned on, while the n-channel MIS (hereinafter referred to as "nMIS") transistors NT21-NT24 are turned off.

In this case, the AND synchronous type NOR circuit constituted by the AND-plane 2a and the precharge circuit 3a is at the precharge period. That is, the potential level of the product term line (hereinafter referred to as "output signal line") Ai (i=1-4) is "H" irrespective of input signals supplied to the input buffer 1. Also in the dummy AND circuit 7a, the pMIS transistor PT71 is turned on and the nMIS transistor NT72 is turned off, and the signal potential AD on the output signal line AD (hereinafter, a signal line and a signal transmitted onto that signal line are designated by the same reference numeral) is at "H".

On the other hand, in the OR-plane, the clock signal CLKOR being output of the inverter 8a is at "L", and the pMIS transistors PT51-PT54 included in the precharge circuit 5a are turned on and the nMIS transistors NT51 circuit NT54 are turned off. Consequently, the synchronous type NOR circuit constituted by the OR-plane 4a and the precharge circuit 5a is also at the precharge period, and each output signal (sum term line) 0i (i=1-4) is at "H" level.

Since the clock signal CLK2 is at the reverse phase with respect to the clock signal CLK1, the clock signal CLK2 is at "L" then. The latch circuits L1-L4 included in the output buffer 6 are at the data holding state in response to the clock signal CLK2 at "L", and latch the output signal 0i in the preceding cycle. Consequently, the output signal OUTi (i=1-4) of the preceding cycle is continuously held and outputted from the output buffer 6.

Next, operation will be described when the clock signal CLK1 changes from "H" to "L". The inverted clock signal CLK1 from the inverter IV1 rises from "L" to "H", and the AND synchronous type NOR circuit constituted by the AND-plane 2a and the precharge circuit 3a and the dummy AND circuit 7a are brought into the evaluation state. That is, in the precharge circuit 3a, the pMIS transistors PT21-PT24 are turned off and the nMIS transistors NT21-NT24 are turned on. Thereby the potential supply lines D21-D24 are connected to the ground potential Vss. Also in the dummy AND circuit 7a, the pMIS transistor PT71 is turned off and the nMIS transistor NT72 is turned on. Thereby the potential line D70 is connected to the ground potential Vss.

As a result, in the AND-plane 2a, among the transistors T21-T27 arranged on the lattice points between the data input lines B1, B1, B2, B2 and the data output lines (product term lines) A1-A4, if a transistor exists having the potential of "H" transmitted to its gate, the potential of the output line Aj to which that transistor is connected, is discharged through the transistor at the conductive state and falls from "H" to "L" level.

In the AND-plane 2a, the output line Aj to which is connected only a transistor element having no signal of "H" transmitted to its gate, maintains the "H" level of the high impedance state.

For example, in the waveform diagram shown in FIG. 2, assume that the input signal IN1 is at "L" and the input signal IN2 is at "H". In this case, transistor elements at the ON-state are the transistor elements T21, T23, T26 and T27. Consequently, the output signal line A3 maintains the "H" level of the high impedance state, and the output signal lines A1, A2 and A4 are discharged through the transistor elements at the ON-state and their potential falls to the "L" level.

Then the transistors at the ON-state connected to the output signal line A2 are two in number, and the transistor at the ON-state connected to the output signal lines A1, A4 is one in number. Since the speed at which the potential level of the output signal line Ai changes from "H" to "L" is nearly inversely proportional to the number of the transistors at the ON-state connected thereto, the discharge is rapid in the output signal line A2 to which the two transistor elements at the ON-state are connected, and the discharge is slow in the output signal lines A1, A4 to which one transistor element at the ON-state is connected.

The dummy AND circuit 7a uses any input signals from the input buffer 1 as its input, and the transistor element is provided corresponding to each input signal line. Therefore the transistor elements having the same number of the inputs (two transistors in FIG. 1) are always turned on. More specifically stated, the situation will be as follows. In the dummy AND circuit 7a, the transistors T73 and T74 turn on complementarily and the transistors T75 and T76 turn on complementarily. Therefore, two transistors always turn on in operation. In the AND plane 2a, at most two transistors turn on in operation with respect to a single output line Ai, because a single output line Ai can not be provided with three transistors in the arrangement shown in FIG. 1. Consequently, the output signal line AD is discharged to "L" at the speed equal to or higher than the highest one of the discharge speed in the output signal line Ai.

In response to the potential transition of the signal AD on the dummy logic output signal line AD, the potential level of the clock signal CLKOR from the inverter 8a varies from "L" to "H". In response to the clock signal CLKOR, the precharge operation of the precharge circuit 5a is finished, and the OR synchronous type NOR circuit constituted by the OR-plane 4a and the precharge circuit 5a is brought into the evaluation state.

That is, since the pMIS transistors PT51-PT54 included in the precharge circuit 5a are turned off and the nMIS transistors NT51-NT54 are turned on, the potential supply lines D41-D44 are connected to the ground potential Vss and the output signal lines 01-04 are separated from the power source potential Vdd. In the OR-plane 4a, among the transistor elements T41-T46 arranged on the lattice points corresponding to the intersection points between the output signal lines (product term lines) A1-A4 from the AND-plane 2a and the output signal lines (sum term lines) 01-04 of the OR-plane 4a, a transistor element having the potential of "H" transmitted to its gate is turned on. Consequently, in the OR-plane 4a, the potential of the sum term line $\overline{0j}$ connected to the transistor element at the ON-state is changed from "H" to "L". The sum term line $\overline{0j}$ to which such transistor element at the ON-state is not connected, remains at the high impedance state of "H".

As seen in the operation waveform diagram shown in FIG. 2, when only the product term line A3 is at "H" level and the level of the product term lines A1, A2 and A4 is "L", in the OR-plane 4a, only the transistor element 42 is turned on and any remaining element is turned off. Consequently, the potential of the sum term line 02 varies from "H" to "L". Then, since the potential transition speed of the product term lines A1 and A4 is slow as shown in FIG. 2, in the transition period that the clock signal CLKOR rises from "L" to "H" and the product term lines A1 and A4 are discharged from "H" to "L", the overlap period is produced at the intermediate voltage between "H" and "L". That is, in response to rise of the clock signal CLKOR, the period is produced in which the nMIS transistor is turned on in the precharge circuit 5a and the transistor element to be turned off in the OR-plane 4a still keeps the ON-state. Consequently in the overlap period, the potential is discharged and lowered through the transistors at the ON-state (transistor elements T41, T46 in FIG. 1). That is, as shown by arrow A in FIG. 2, since the discharge speed of the product term lines A1, A4 is slow, the signal potential on the sum term line 01, 04 is slightly lowered to a certain intermediate voltage.

On the other hand, if the clock signal CLK1 falls to the "L" level, the clock signal CLK2 at the reverse phase thereof rises to the "H" level. In response to this, the latch circuits L1-L4 included in the output buffer 6 become the through state where the signal supplied to the input portion is transmitted as it is to the output portion. Consequently, in response to rise of the clock signal CLK2 to "H", the output signal OUTi from the output buffer circuits 6a-6d receives the precharge voltage of the sum term line $\overline{0i}$ and once becomes the "L" level. Then the output signal OUTi also varies in response to the potential variation of the sum term lines 01-04. Then, the intermediate voltage of the sum term lines 01, 04 held to intermediate voltage is higher than the input logic threshold voltage of the output buffer 6 (logic threshold voltage of the latch circuits L1-L4) and therefore is deemed as "H".

According to the above-mentioned operation, the output signal OUTi through the prescribed logic operation processing to the input signal INi is outputted from the output buffer 6. Relation between the input signal INi and the output signal OUTi depends on the program state, i.e., the arrangement of the transistor elements arrayed in the AND-plane 2a and the OR-plane 4a.

If the clock signal CLK2 falls to the "L" level, each of the latch circuits L1-L4 included in the output buffer 6 latches the supplied signal and outputs it continuously.

In the constitution of the above-mentioned example of prior art, the correspondence between the input signal INi and the output signal OUTi is as follows.

01=OUT1=IN1·IN2

02=OUT2=IN1·IN2

O3=OUT3=IN1·IN2

O4=OUT4=IN1

Next, if the clock signal CLK1 is changed from "L" to "H", the synchronous type NOR circuit constituted by the AND-plane 2a and the precharge circuit 3a and the dummy AND circuit 7a first become the precharge state. In response to the transition of the dummy AND circuit 7a to the precharge state, the clock signal CLKOR from the inverter 8a varies from "H" to "L", and the synchronous type NOR circuit constituted by the OR-plane and the precharge circuit 5a becomes the precharge state. Thereby, except for data latched in the latch circuits L1-L4 included in the output buffer 6, the logic device is returned to the initial state.

The programmable logic device in the prior art is constituted as above described, and performs control of the precharge/evaluation operation using output signals from the dummy AND circuit. Consequently, after starting the evaluation of the AND-plane, the OR-plane can be brought into the evaluation state.

The inverter 8a to derive the clock signal for controlling the operation of the OR-plane has a large drive ability enough to drive the transistors PT51-PT54 and NT51-NT54 of the precharge circuit 5a for the OR-plane, and the rise speed of the clock signal CLKOR is great. Consequently at the time of finishing the precharge operation of the precharge circuit 5a for the OR-plane always, the discharge of the product term line is not yet performed sufficiently, and the period is produced in which the transistor element to be turned off in the evaluation state maintains the ON-state. Consequently, the potential of the sum term line Oi to maintain the "H" level potential is lowered to the intermediate potential, and the danger is increased that the signal potential in error is detected and outputted in the output buffer.

The degree of potential reduction of the sum term line to the intermediate potential becomes large as the scale of the logic device becomes large. The reason is as follows. As the number of input signals increases, the difference between the minimum discharge speed of the product term line Ai and the variation speed of the output signal AD of the dummy AND circuit 7a becomes large. On the other hand, when the number of the output signals increases, the number of the precharge transistors of the precharge circuit 5a for the OR-plane also increases accordingly, and therefore the inverter buffer 8a having large drive ability is used and the change speed of the clock signal CLKOR significantly exceeds the potential change speed of the product term line Ai. That is, after finishing the precharge, longer time is required for the transistor to be turned off in the OR-plane to hold the ON-state during the high impedance state of the sum term line. Consequently, longer time is required for the potential of the sum term line at the high impedance state to be discharged through such a transistor.

In general, the output buffer is provided at its input stage with a CMOS (complementary insulated gate transistors) inverter connected between the reference potential Vdd and another reference potential Vss. According to the intermediate potential on such sum term line, both the pMIS transistor and the nMIS transistor are turned on, and a problem occurs that the current flows through the transistors and the power consumption increases.

Further, two clock signals, clock signal for controlling the operation of the AND-gate and the OR-plane and clock signal for controlling the latch operation in the output buffer, must be used. Consequently, a problem occurs that the wiring occupation area of the clock signals increases, and the two-phase clock signals not to overlap each other have an overlap portion in the high speed operation state, and thereby accurate logic operation cannot be performed and also the timing design of the two-phase clock signals becomes difficult.

Further problem exists that the potential supply line for discharge is provided corresponding to each of the product term line and the sum term line, whereby the signal wiring occupation area increases and the high integration of the logic device is significantly obstructed.

In the constitution that the precharge and the evaluation operation of the OR-plane are controlled using the dummy AND circuit output, one operation cycle time depends on the evaluation finishing time, i.e., the time required from establishing the potential on the sum term line until latch of the established potential by the output buffer. Since the margin must be estimated for this time, a problem exists that the precharge timing of the OR-plane cannot be set so rapidly and the implementation of the logic device with high speed is difficult.

SUMMARY OF THE INVENTION

An object of the invention is to provide an improved programmable logic device wherein disadvantages of the above-mentioned programmable logic device in the prior art are eliminated.

Another object of the invention is to provide a programmable logic device wherein high speed operation is performed without erroneous operation.

A further object of the invention is to provide a programmable logic device wherein the signal wiring occupation area is reduced, and clock signals for controlling the precharge/evaluation of the OR-plane can be easily generated at the optimum timing irrespective of the device scale.

Still another object of the invention is to provide a programmable logic device wherein high speed operation can be performed securely with low power consumption and the high integration is applied suitably.

Still another object of the invention is to provide a programmable logic device wherein the precharge timing in the OR-plane can be made earlier and the precharge period can be decreased and high speed operation can be performed.

Still further object of the invention is to provide a programmable logic device wherein the operation timing for precharge/control of the AND-plane and the OR-plane and the timing of the latch operation in the output buffer can be easily designed without deteriorating the high speed property.

A programmable logic device according to the invention comprises a first logic plane applying a prescribed logic processing to input signals, a second logic plane further applying logic processing to output signals from the first logic plane, a first dummy logic circuit performing a logic operation and deriving the same output signals always irrespective of input signals, and a second dummy logic circuit receiving outputs of the first dummy logic circuit.

The first dummy logic circuit comprises means for changing the output signal state at the same potential change speed as the slowest potential change speed of the output signal lines in the first logic plane. That is, the first dummy logic circuit has an output signal line to which are connected transistor elements of the same number as transistor elements potentially connectable to one output signal line in the first logic plane, and only one transistor element among those transistor elements is normally set to the ON-state and any of the remaining transistor elements thereof is normally set to the OFF-state.

The second dummy logic circuit has an output signal line to which is connected the same load capacitance as the capacitance provided by transistor elements potentially connectable to one input signal line in the second logic plane.

A first buffer circuit is installed between the output signal line of the first logic plane and the input signal line of the second logic plane, and a second buffer circuit is installed between the output signal line of the first dummy logic circuit and the input signal line of the second dummy logic circuit. The first and second buffer circuits drive the associated input signal lines at high speed in response to the potential on the associated output signal lines.

The programmable logic device according to the invention further comprises clock generating means for generating internal controlling clock signals in response to clock signals supplied from an outside, a first precharge means for precharging the output signal lines of the first logic plane and the first dummy logic circuit to a prescribed potential in response to clock signals from the clock generating means, a second clock generating means for generating second clock signals in response to clock signals from the clock generating means and outputs of the second buffer circuits, and a second precharge means for precharging the output signal line in the second logic plane in response to clock signals from the second clock generating means.

In each of the first logic plane, the second plane and the first dummy logic circuit, output signal lines are grouped per two lines, and one potential supply line common to the two output signal lines in a pair is provided for supplying a second reference potential being different from the precharge potential. Each of transistor elements of the first logic plane, the second logic plane and the first dummy logic circuit connects the associated output signal line selectively to the associated reference potential supply line in response to the signal potential on the associated input signal line.

The programmable logic device according to the invention comprises clock delay-means for delaying the first clock signal for controlling the precharge operation of the first logic plane by a prescribed time and transmitting the delayed signal, and a latch circuit for latching the signal potential on the output signal line of the second logic plane in response to the delayed clock signal from the clock delay means. The delay time by the clock delay means is set to a time shorter than the delay time required until the first clock signal is transmitted to the precharge circuit for the second logic plane.

The first dummy logic circuit changes the output signal at a speed equal to or less than the slowest potential change speed in the first logic plane. The precharge operation of the second logic plane is finished in response to the input signal line of the second dummy logic. The input signal line potential of the second dummy logic circuit changes at a speed equal to or less than the slowest potential change speed of the input signal line of the second logic plane. Consequently, the precharge finishing of the second logic plane and the evaluation starting are performed after any of the transistor elements to be turned off in the second logic plane is assured to be the OFF-state, and thereby the output signal line potential in the second logic plane is prevented from lowering to the intermediate potential.

Since one reference potential supply line common to the two output signal lines is provided in the first and second logic planes, the signal wiring occupation area can be reduced.

Clocks from the same clock generating source are used as the clock for controlling the operation of the output latch circuit and as the clock for controlling the precharge/evaluation operation in the output latch and the first and second logic, and the used clocks are different from each other only in the delay time. Thereby the occupation area of the clock signal wiring can be reduced, and the timing design for the precharge/evaluation in the output latch and the first and second logic planes becomes easy.

Since the clock for controlling the precharge of the second logic plane is created in response to the clock from the clock generating source and the input to the second dummy logic circuit, the precharge operation in the second logic plane is finished to be changed to the evaluation state after the establishment of the input signal line potential in the second logic plane, and the precharge starting in the second logic plane can be set by the clock from the clock generating source, whereby the precharge start timing can be set earlier without an adverse influence on the evaluation state in the second logic plane.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
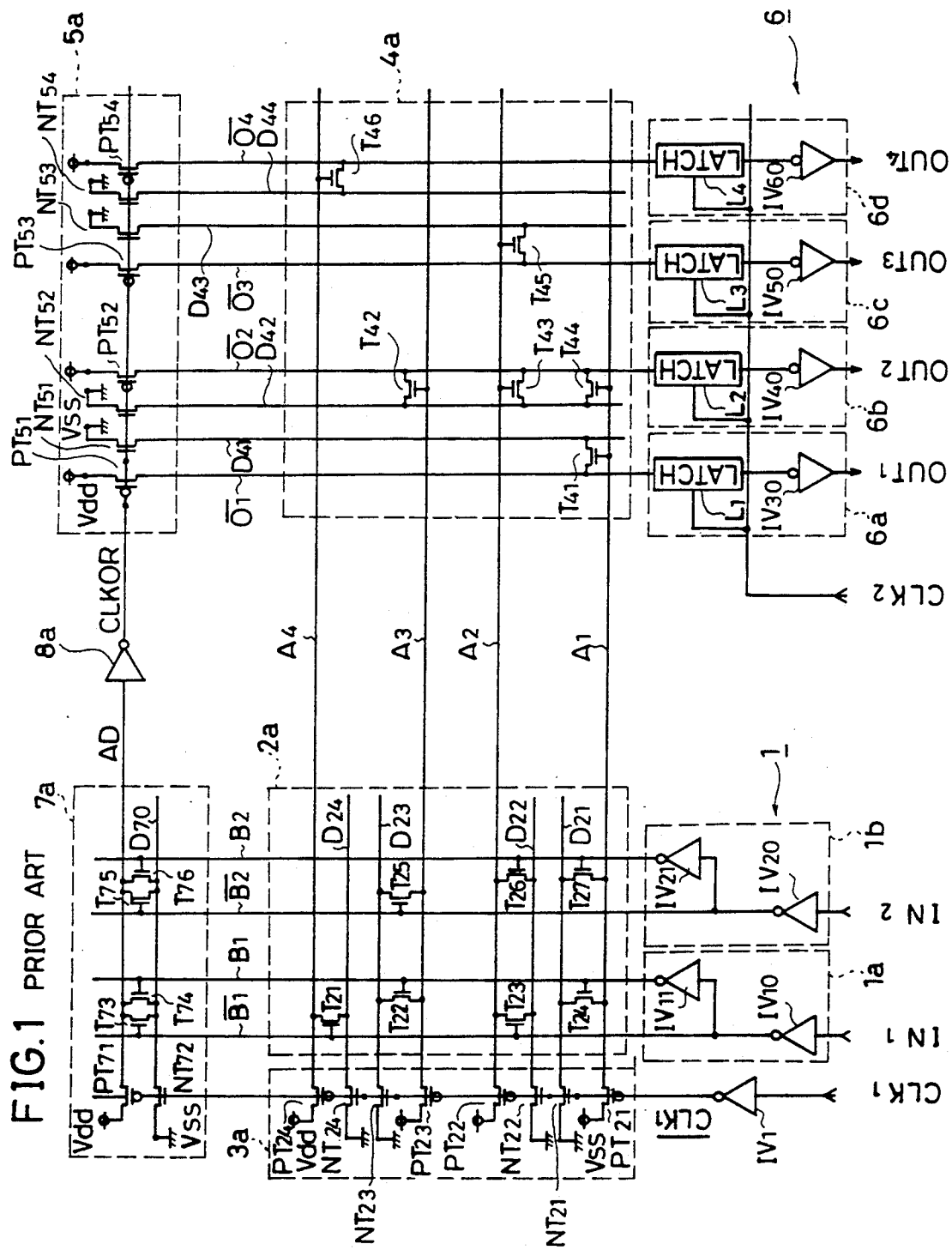
FIG. 1 is a diagram showing an example of constitution of a programmable logic device in the prior art.
Figure 2:
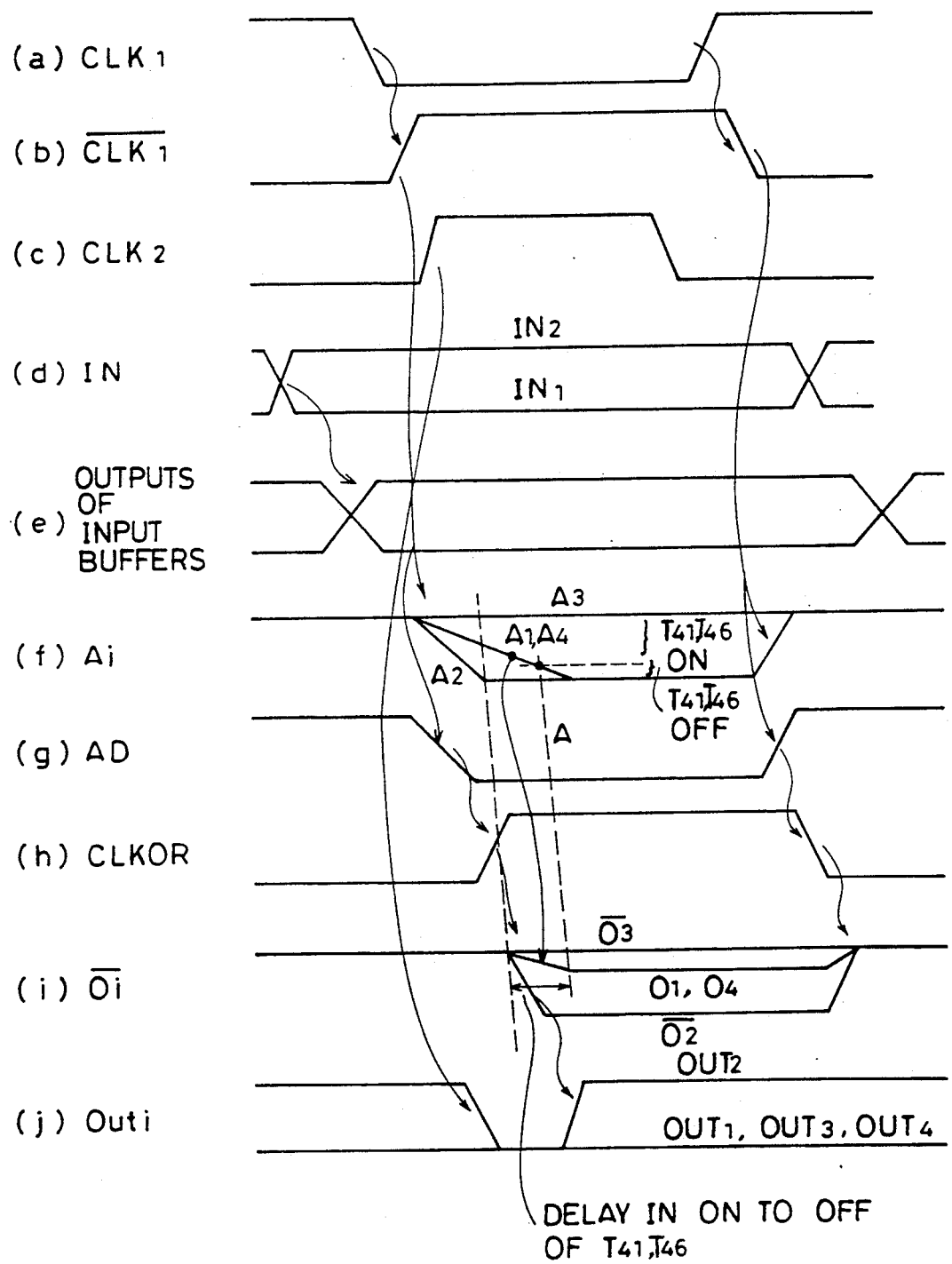
FIG. 2 is a signal waveform diagram illustrating operation the logic device shown in FIG. 1.
Figure 3:
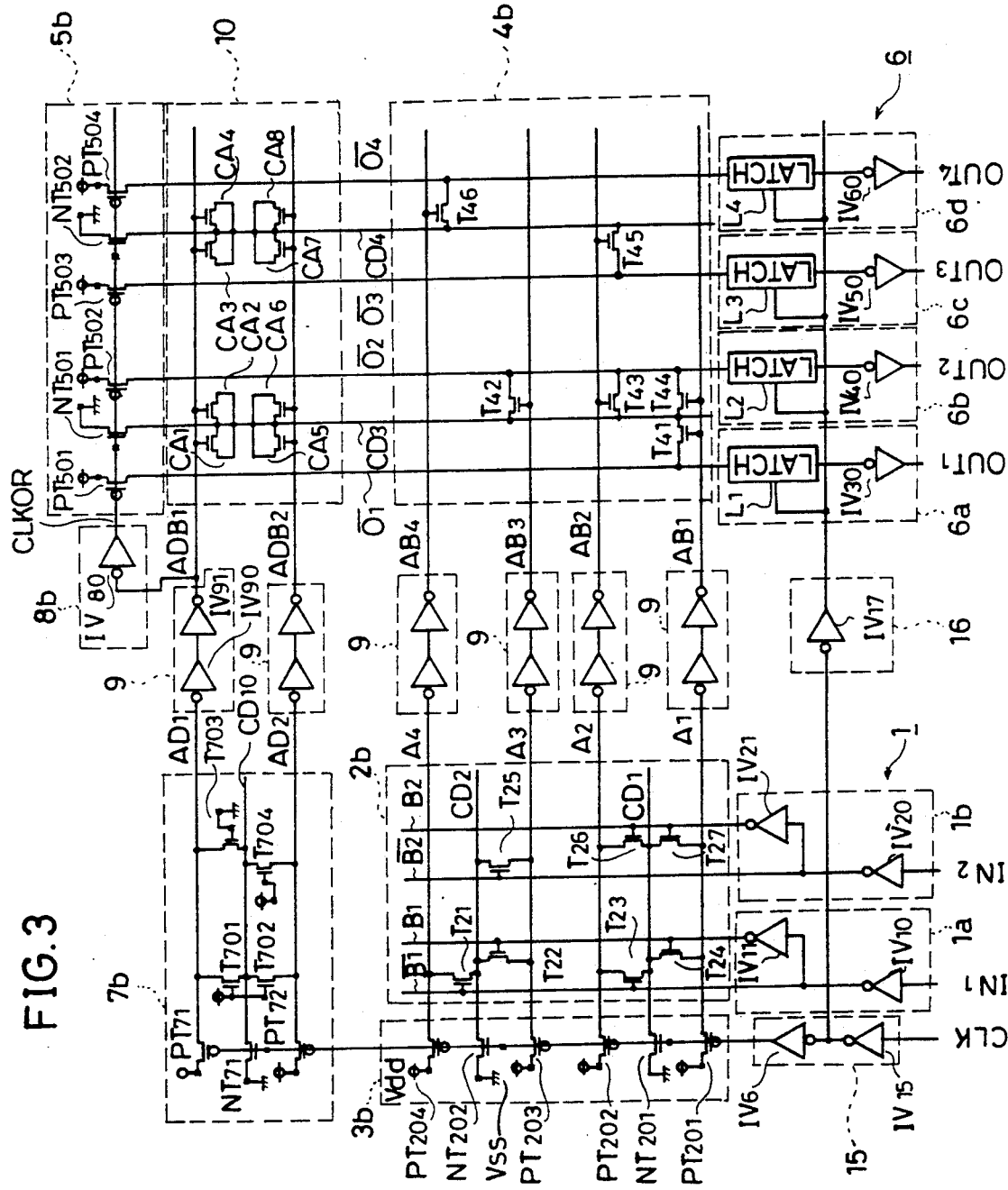
FIG. 3 is a diagram showing constitution of a programmable logic device according to an embodiment of the invention.

FIG. 3 is a diagram showing an example of constitution of a programmable logic device according to an embodiment of the invention. The logic device shown in FIG. 3 performs similar operation to that of the logic device in the prior art shown in FIG. 1, and the corresponding parts are designated by the same reference numerals as those in FIG. 1.

Referring to FIG. 3, the logic device comprises an AND-plane 2b performing the prescribed logic operation on the input signals from input buffer circuits 1a, 1b, a precharge circuit 3b for precharging the AND-plane, an OR-plane 4b further applying the prescribed logic processing to output signal from the AND-plane 2b and outputting the processed signal, and an output buffer 6 for latching output of the OR-plane 4b and outputting the latched signals.

In the AND-plane 2b and the precharge circuit 3b, output signal lines are grouped per two lines, and each one of the reference potential supply lines CD1, CD2 is provided for the two adjacent output signal lines in a pair. That is, the reference potential supply line CD1 is provided commonly for the product term lines A1 and A2, and the reference potential supply line CD2 is provided commonly for the product term lines A3 and A4. The AND-plane 2b and the precharge circuit 3b constitute an AND synchronous type NOR circuit.

In order to generate clock signals for controlling the precharge/evaluation operation in the OR-plane 4b, a dummy AND circuit 7b, a dummy OR circuit 10 and an inverter buffer circuit 8b are installed.

The dummy AND circuit 7b is provided with dummy logic output signal lines AD1 and AD2 in a pair. A reference potential supply line AD1 and AD2. Transistor elements of the same number as maximum number of the transistor elements connectable to one product term line in the AND-plane 2b (i.e., two in the embodiment shown in FIG. 3) are connected to the output signal lines AD1 and AD2 of the dummy AND circuit 7b. That is, transistor elements T701 and T703 are connected to the dummy logic output signal line AD1, and transistor elements T702 and T704 are connected to the output signal line AD2. Each of the transistor elements T701, T702 and T704 has its gate connected to the first reference potential Vdd, and is normally turned on. The transistor element T703 has its gate connected to the second reference potential Vss, and is normally turned off. Thereby the potential change speed (discharge speed) of the output signal AD1 is set to a speed equal to or less than the slowest discharge speed among the discharge speeds of the product term lines in the AND-plane.

The dummy OR circuit 10 has input signal lines ADB1 and ADB2. The same load capacitance as that supplied by transistor elements of the maximum number connectable to the input signal lines in the OR-plane is connected to the input signal lines ADB1 and ADB2 respectively. That is, capacitances CA1, CA2, CA3 and CA4 of the same number as the output number of the OR-plane (four in the embodiment shown in FIG. 3) are connected to the input signal line ADB1, and signal line ADB2. The capacitances CA1-CA8 are formed by having that source and drain of a MIS transistor connected to the reference potential supply line.

Also in the OR-plane 4b, the output signal lines are arranged per two lines in a pair, and each one of the reference potential supply lines CD3 and CD4 is provided for the two output signal lines in a pair.

Due to the load capacitance in the dummy OR circuit 10, the potential of input signals of the input signal lines ADB1 and ADB2 can be changed at a change speed equal to or less than the slowest change speed of the input signal lines AB1-AB4 in the OR-plane 4b.

In order that change of the signal potential of the input signal lines AB1-AB4 as well as ADB1 and ADB2 of the OR-plane 4b and the dummy OR circuit 10 is made as rapid as possible, buffer circuits 9 receiving the signal potential of the output signal lines A1-A4 as well as AD1 and AD2 are installed. Each buffer circuit 9 is constituted by inverters IV90 and IV91 in cascade connection of two stages.

A buffer circuit 8b generates the clock signal CLKOR to control the operation of the precharge circuit 8b in response to the signal potential on the input signal line ADB1 of the dummy OR circuit 10. Thereby the clock signal CLKOR is generated after the signal potential on the input signal line with the slowest transition speed in the OR-plane 4b is established and the precharge operation of the precharge circuit 5b is finished.

The dummy AND circuit 7b is arranged adjacent to the AND-plane 2b and the precharge circuit 3b, and the dummy OR circuit 10 is arranged adjacent to the OR-plane 4b or the precharge circuit 5b. This intends to facilitate the layout. Further the dummy AND circuits 7b and 10 have the two output signal lines AD1, AD2 and the input signal lines ADB1, ADB2 respectively so that the wiring pattern in the AND-plane 2b is repeated and the logic device can be easily designed.

Clock signals to control the latch operation of the latch circuits L1-L4 included in the output buffer 6 are transmitted through the clock generators 15 and 16. The clock generator 15 transmits the clock signal CLK supplied from the outside to the precharge circuit 3b and the precharge circuit included in the dummy AND circuit 7b, and also transmits it through the inverter IV15 included therein to the clock delay circuit 16. The clock generator 15 has inverters IV15 and IV16 in cascade connection of two stages, and the clock delay circuit 16 has an inverter buffer IV17 of one stage. Consequently, the latch operation of the latch circuits L1-L4 included in the output buffer 6 is controlled by the clock signal in phase with respect to the clock signal CLK supplied from the outside.

Figure 4:
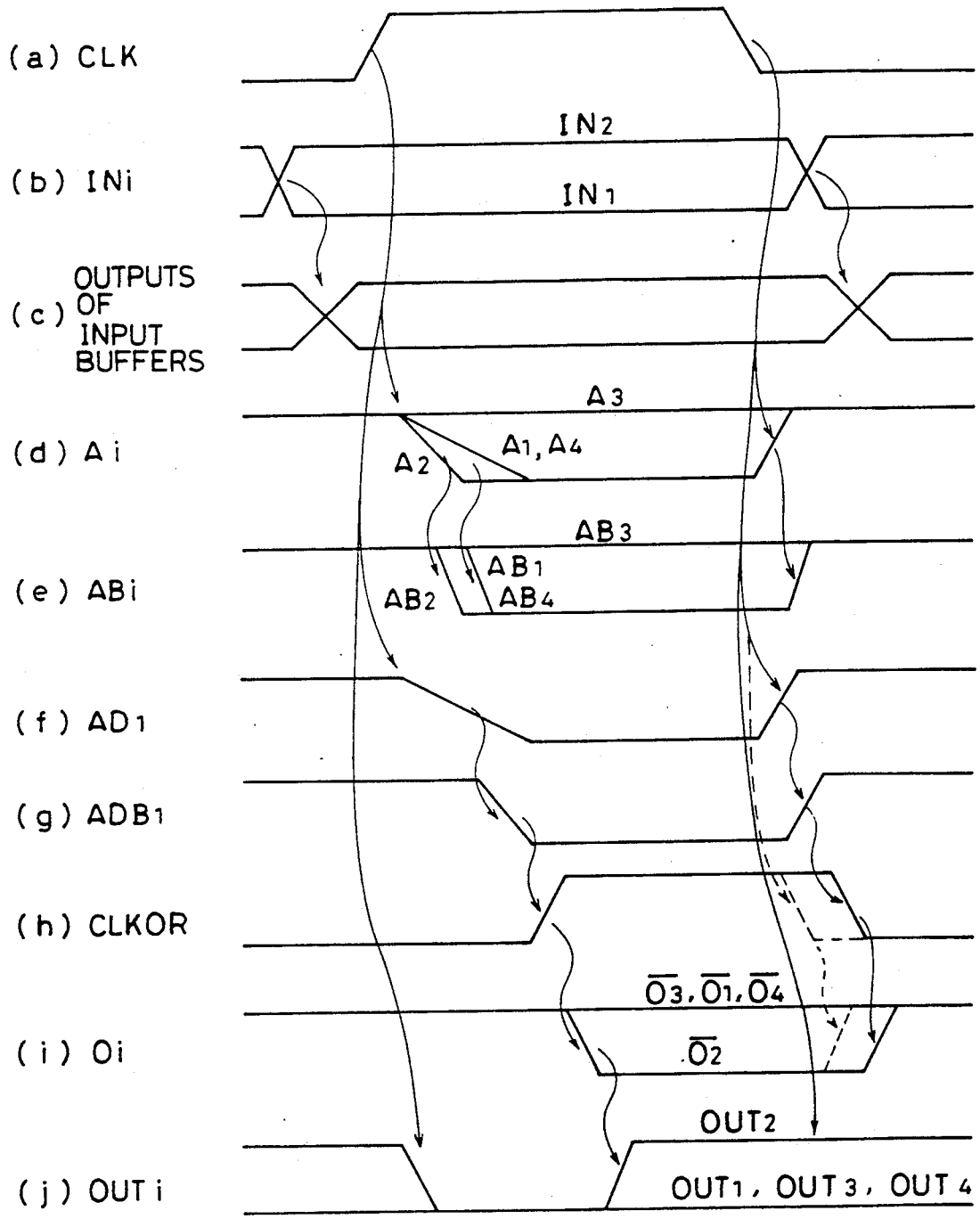
FIG. 4 is a signal waveform diagram illustrating operation of the programmable logic circuit shown in FIG. 3.

In this constitution, regarding the clock signal transmitted to the latch circuits L1-L4 in the output buffer 6, although the clock signal CLK is only subjected to the delay by the logic gates of two stages through the inverters IV15 and IV17, the clock CLKOR in the precharge circuit 5b in the OR-plane has the delay time by the inverters IV15, IV16, the dummy and circuit 7b, the buffer circuit 9 and the inverter buffer circuit 8b, i.e., the logic gates of six stages in total for the clock signal CLK. Next, operation will be described referring to FIG. 4 being its operation waveform diagram.

While the clock signal CLK is at "L", the pMIS transistors PT201-PT204 included in the precharge circuit 3b are turned on, and the nMIS transistors NT201 and NT202 are turned off. Also in the dummy AND circuit 7b, the pMIS transistors PT71, PT72 are turned on, and the nMIS transistor NT71 is turned off. Consequently, any of the output signal lines (product term lines) A1-A4 in the AND-plane 2b is precharged to the level of the reference potential Vdd irrespective of the input signal, and the dummy logic output signal lines AD1 and AD2 are also precharged to the level of the reference potential Vdd.

In this case, the clock signal CLKOR is also at "L", and the pMIS transistors PT501-PT504 in the precharge circuit 5b are turned on and the nMIS transistors NT501 and NT502 are turned off. Consequently, the OR-plane 4b is also at the precharge state irrespective of the state of the input signal lines AB1-AB4. Then the latch circuits L1-L4 included in the output buffer 6 hold the output signals outputted in the preceding cycle and output these signals. That is, inverted data of the data held by the latch circuits L1-L4 respectively are outputted as the output signals OUT1-OUT4 from the output buffer 6.

Next, operation will be described in the case that the clock signal CLK changes from "L" to "H". If the clock signal CLK rises from "L" to "H", the precharge operation by the precharge circuit 3b is finished, and the AND synchronous type NOR circuit constituted by the AND-plane 2b and the precharge circuit 3b as well as the dummy AND circuit 7b become the evaluation state. In the evaluation state, the transistor element with its gate being at "H" is turned on in response to the signal potential of the input signals IN1, IN2 supplied to the input buffer 1. Depending on the number of the transistor elements at the ON-state connected thereto, the product term lines A1-A4 change from "H" to "L" at various speeds or hold the "H" level of high impedance.

The drivability of the buffer circuit 9 is larger than the ability for the AND synchronous type NOR circuit to drive the product term lines A1-A4. Consequently, the signal potential of the input signal lines AB1-AB4 changes at high speed, although the potential change of start time of the input signal lines AB1-AB4 is delayed with respect to the potential change start time of the product term lines A1-A4. In the operation waveform diagram of FIG. 4, an example is shown for the case that the input signal IN1 is at "L" and the input signal IN2 is at "H".

On the other hand, in the dummy AND circuit 7b, the transistor element at the ON-state connected to the dummy logic output signal line AD1 is one in number, and the potential level of the output signal line AD1 changes at the speed equal to or slower than that of the product term line having the slowest change speed among the product term lines A1-A4. This applies always irrespective of the number of the input signals, because the discharge of the dummy logic output signal line AD1 of the dummy AND circuit 7b is performed through only one transistor element whatever number of the input signals are supplied to the input buffer 1.

The load capacitance associated with the input signal line ADB1 of the dummy OR circuit 10 is nearly equal to or greater than the maximum among those for the input signal lines AB1-AB4 of the OR-plane 4b. Consequently, the dummy logic input signal line ADB1 changes from "H" to "L" at change speed nearly equal to or lower than the lowest change speed among those of the input signal lines AD1-AD4 of the OR-plane 4b. It applies always irrespective of the number of the input signals and the output signals that the change speed of the dummy logic input signal line ADB1 is nearly equal to or slower than the slowest change speed of the input signal lines in the OR-plane 4b. This is because the load capacitance associated with the dummy logic input signal line ADB1 is set nearly equal to the maximum load capacitance by the input signal lines connectable in the OR-plane 4b.

The clock signal CLKOR from the inverter buffer circuit 8b rises from "L" to "H", when the dummy logic input signal ADB1 changes and exceeds the logic threshold voltage of the buffer circuit 8b. The precharge circuit 5b finishes the precharge operation when the clock signal CLKOR rises to "H". Thereby the OR synchronous type NOR circuit constituted by the OR-plane 4b and the precharge circuit 5b enters the evaluation state after the signal potential of the input signal line ABi (i=1-4) is established.

In the OR-plane 4b, the output signal line, i.e., the sum term line 0i (i=1-4) changes from "H" to "L", depending on the number of the transistors connected thereto. Then in the line having the potential to be changed to "L" among the input signal lines AB1-AB4, its potential level is established to "L" already when the precharge is finished in the precharge circuit 5b. Consequently, since the rise of the clock signal CLKOR from "L" to "H" does not intersect in a time with the transition of the input signal line ABi in the OR-plane 4b from "H" to "L" and the transistor element to be turned off is not at the ON-state, the sum term line to remain in the "H" level in the sum term line of the OR-plane 4b is not lowered to an intermediate potential.

Thereby the generation of the penetrating current in the latch circuits L1-L4 in the output buffer 6 and the detection of the erroneous data can be prevented.

When the OR synchronous type NOR circuit enters the evaluation state, the clock signal supplied to the latch circuit L1-L4 included in the output buffer 6 already rises to "H". Consequently, the latch circuit L1-L4 once allow the signal potential of "L" is outputted from the output buffer 6. Subsequently the signal of "L" or "H" is outputted from the output buffer 6 in response to the signal potential on the sum term line 0i. In the operation waveform diagram of FIG. 4, an example is shown for the case that the output signals OUT1, OUT3 or OUT4 are at "L" and the output signal OUT2 is at "H".

Next, if the clock signal CLK falls from "H" to "L", the latch function of the latch circuits L1-L4 included in the output buffer 6 is enabled, and the signal potential on the sum term lines 01-04 is latched and outputted continuously.

Also in response to the fall of the clock signal CLK to "L", the AND synchronous type NOR circuit becomes the precharge state, and subsequently the clock signal CLKOR falls to "L" and the OR synchronous type NOR circuit becomes the precharge state.

Since the stage number of gates through which the clock signal CLK passes until transmitted to the latch circuit of the output buffer 6 is less than the stage number of gates through which the clock signal CLK passes until transmitted to the precharge circuit 5b, the propagation delay time of the clock CLK for the output buffer is shorter. Consequently, the timing at which the latch circuits L1-L4 in the output buffer 6 are changed to the signal holding state is always earlier than the timing at which the sum term line 0i is precharged by the precharge circuit 5b and is changed to "H".

Since setting of the data latch timing in the output buffer 6 and the timing of the precharge operation of the OR synchronous type NOR circuit is performed using the clock signal in phase from the same clock generator being different only in the delay time, even at the high speed operation, the precharge is finished in the OR-plane 4b and is replaced with the evaluation state always after the latch function in the output buffer 6 is released, and the latch function can be activated after the signal potential on the output signal line (sum term line) 0i by the evaluation state in the OR-plane 4b is established, and thereby not only the reduction of the occupation area of the clock signal line but also the setting of the clock timing can be facilitated.

Figure 5:
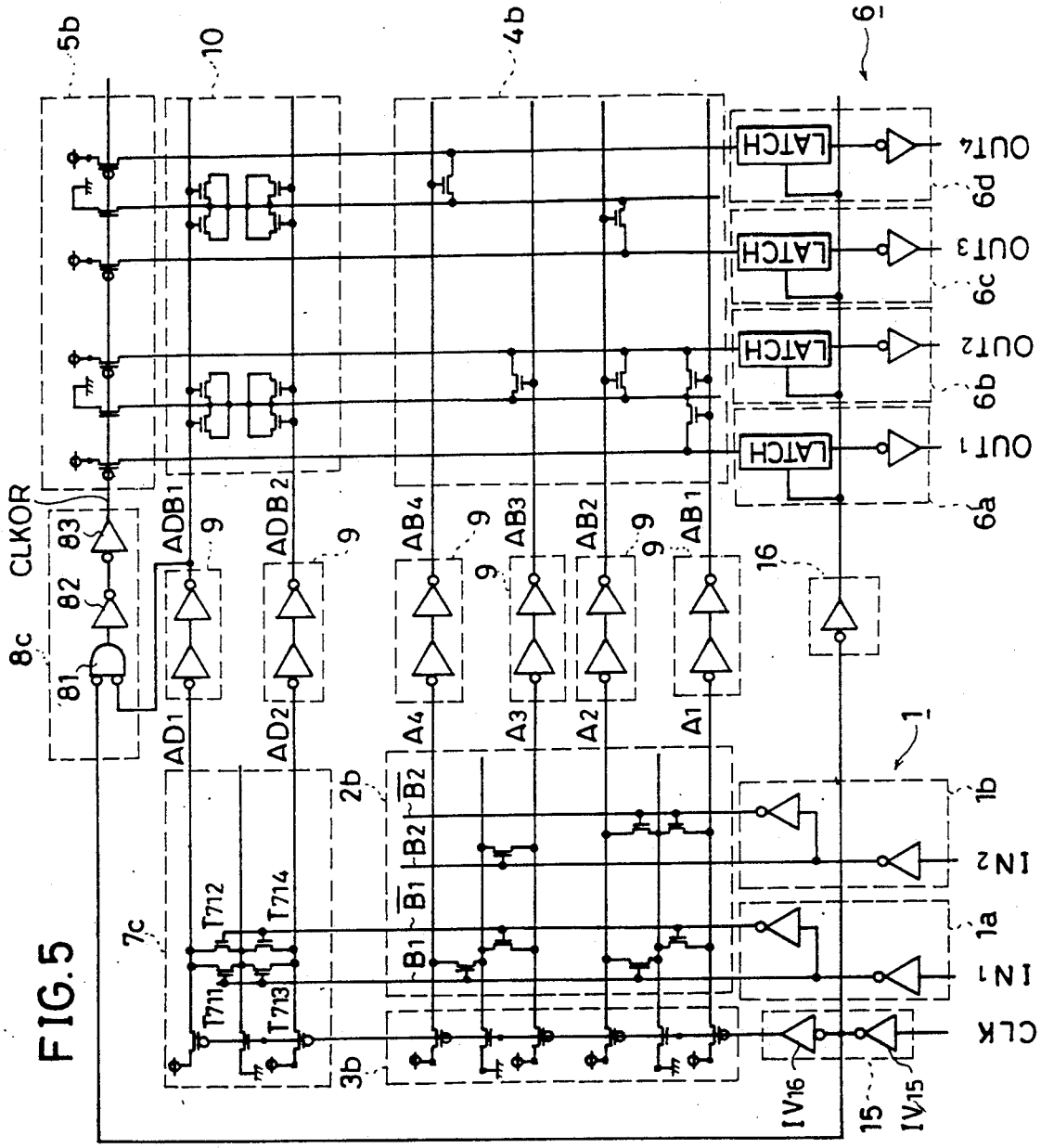
FIG. 5 is a diagram showing constitution of a programmable logic device according to another embodiment of the invention.

FIG. 5 shows constitution of a programmable logic device as another embodiment of the invention. In FIG. 5, a dummy AND circuit 7c comprises transistor elements T711, T712 and T713, T714 in pairs, whose gates are connected to complementary signal lines from one output buffer circuit 1a (input signal lines from an AND-plane 2b). Respective one conduction terminals (source) of the transistor elements T711 and T712 are connected to a dummy logic output signal line AD1, and respective one conduction terminals (source) of the transistor elements T713 and T714 are connected to a dummy logic output signal line AD2.

The logic device shown in FIG. 5 further comprises an OR-plane precharge clock signal generating buffer circuit 8c for generating precharge control clock signals CLKOR in response to signal potential on an input signal line ADB1 of a dummy AND circuit 10 and clock signal from a clock generator 15. The buffer circuit 8c comprises a NOR gate 81 receiving signal on the dummy logic input signal line ADB1 and output of an inverter IV15 included in the clock generator 15, and inverters 82 and 83 in cascade connection of two stages for receiving output of the NOR gate 81. The precharge control clock signal CLKOR is generated from the inverter 83.

In constitution shown in FIG. 5, since complementary signals are always transmitted onto the input signal lines B1, B1 for the AND-plane 2b, only either of the transistor elements T711 and T712 connected to one dummy logic output signal line AD1 is always turned on. Consequently, also in this constitution, the potential change speed of the dummy logic output signal line AD1 can be made nearly equal to or slower than the slowest potential change speed of a product term line Ai of the AND-plane 2b.

The buffer circuit 8c also generates the OR-plane precharge clock signal CLKOR in response to clock signal from the clock generator 15 (inverter IV15) and the signal potential on the signal line ADB1. In this constitution, the precharge finishing time instant of the OR-plane, i.e., the time instant of rising of the clock signal CLKOR to the "H" level is similar to that in the constitution shown in FIG. 3. However, since the stage number of logic gates through which the clock signal CLK passes until transmitted to the buffer circuit 8c can be reduced in comparison with the constitution shown in FIG. 3, the timing of the clock signal CLKOR falling from "H" to "L" becomes earlier in comparison to the constitution of FIG. 3 as shown by broken line in FIG. 4 and the precharge start timing in the OR-plane can be set earlier. In this case, in the output buffer 6, since the delay time of the clock signal transmitted is always shorter than the delay time of the clock signal transmitted to the precharge circuit 5b, the precharge operation of the OR-plane is securely executed after the latch function is activated in the output buffer 6. Consequently, the precharge timing can be set earlier without producing the erroneous operation in the OR-plane, and thereby the operation cycle time can be decreased and the high speed logic operation can be realized.

Figure 6:
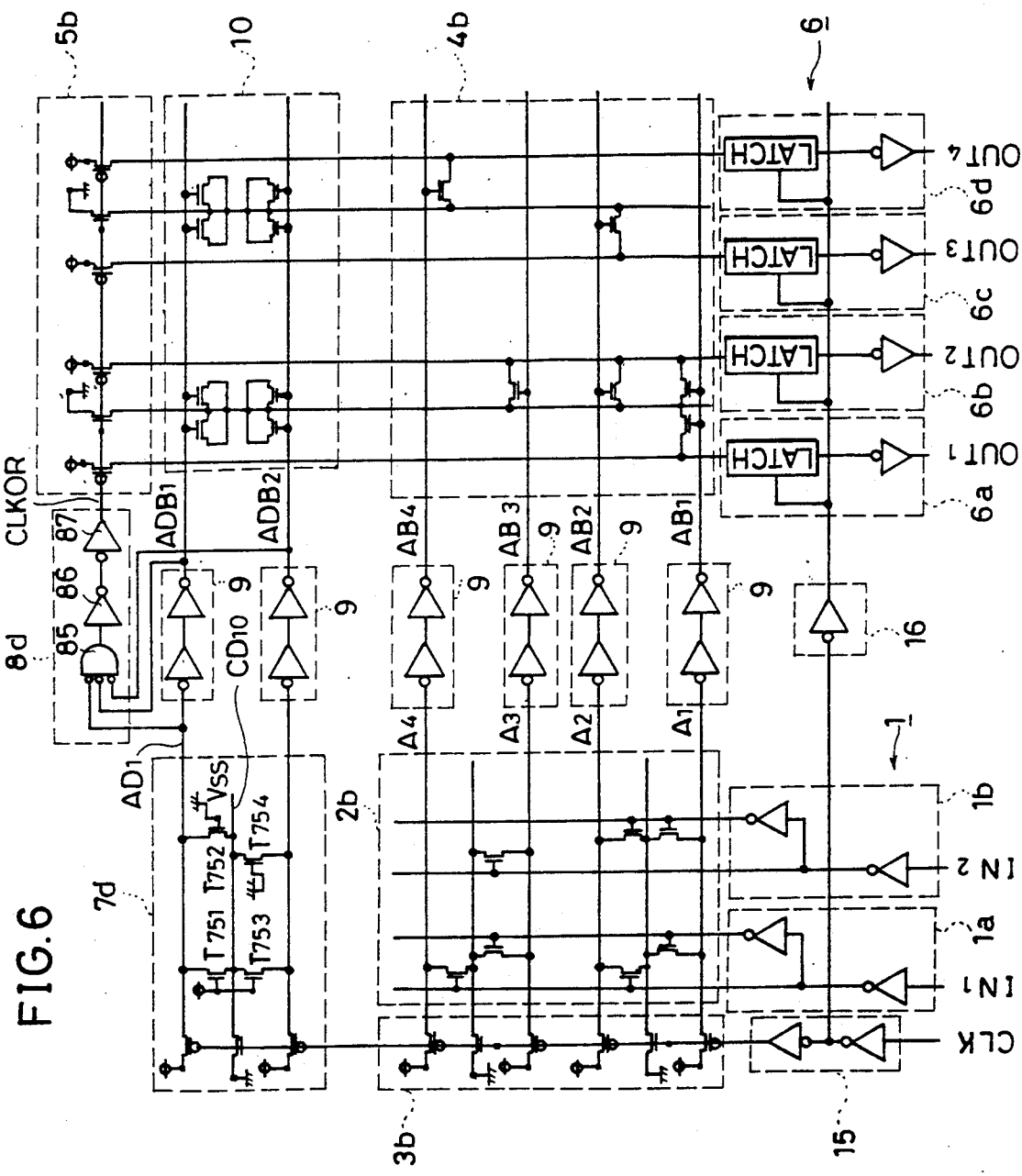
FIG. 6 is a diagram showing constitution of a programmable logic device according to a further embodiment of the invention.

FIG. 6 is a diagram showing constitution of a programmable logic device according to a further embodiment of the invention. In FIG. 6, a dummy logic circuit 7d comprises transistor elements T751, T752, T753 and T754 normally turned on. The transistor elements T751 and T752 are connected to a dummy logic output signal line AD1, and the transistor elements T753 and T754 are connected to a dummy logic output signal line AD2.

In general, in the MIS transistor, the larger the gate length L, the larger the parasitic capacitance, and the smaller the gate width W, the smaller the parasitic capacitance. On the other hand, the larger the gate width W, the larger the current supply ability. Further the conductance of the MIS transistor is proportional to the ratio of the gate width to the gate length, i.e., W/L.

Since the parasitic capacitance due to the MIS transistor is connected in parallel between the signal line AD1 and the reference potential supply line CD10, the discharge time constant of the signal lines AD1 and AD2 is proportional to the product of the combined parasitic capacitance C and the combined ON-resistance R due to the MIS transistor. For example, when one signal line AD1 only is used to generate the precharge clock signal CLKOR, if the ON-resistance of the transistor elements T751 and T752 is set high by decreasing the gate width, increasing the gate length or raising the threshold voltage, the discharge speed of the dummy logic output signal lines AD1 and AD2 can be set less than the slowest discharge speed of the product term line in the AND-plane 2b even if all transistor elements T751–T754 are normally turned on. Accordingly, similar function to the dummy logic circuit shown in FIG. 3 or FIG. 5 can be realized. It does not require another clock supply wiring for producing the clock CLKOR.

Further in the logic device shown in FIG. 6, a buffer circuit 8d for generating the precharge clock signals CLKOR comprises a three-input NOR gate 85 for receiving the signal potential on the dummy logic output signal line AD1 and the signal potentials of the input signal lines ADB1 and ADB2 to the dummy logic circuit 10 respectively, and inverters 86 and 87 in cascade connection of two stages for receiving output of the NOR gate 85. In the dummy circuit 7d, the transistors T751 and T753 are turned on, and the transistors T752 and T754 are kept off. In the buffer circuit 8d, the transition timing of the clock signal CLKOR from the "L" level to the "H" level is similar to that shown in FIG. 3 or FIG. 5 and can be set after the signal potentials on the input signal lines AB1–AB4 in the OR-plane 4b are established. However, the timing at which the clock signal CLKOR changes from the "H" level to the "L" level becomes earlier in comparison with that of the constitution shown in FIG. 6, the transition of the clock signal CLKOR from the "H" level to the "L" level is effected in response to the rise of the signal potential on the signal line AD1 to the "H" level. Consequently in this case, the delay due to the logic gates affecting the clock signals from the clock generator 15 to the dummy logic output signal line AD1 can be decreased by the delay time of the logic gates in the buffer circuit 9 in comparison with the constitution shown in FIG. 3. After the start of the precharge in the OR-plane, even if the clock signal CLK changes at the same timing, it can be made earlier in comparison with the constitution shown in FIG. 3. Thereby the logic device can be obtained in which reduction of the precharge time and reduction of the operation cycle can be realized and the high speed operation can be performed.

In principle, the output ADB1 and ADB2 are the same in behavior. However, due to difference of manufacturing parameters, each circuit 9 is slightly different in operation characteristics from other. Thus, the output signals ADB1 and ADB2 are different in phase. The rising edge of the clock CLKOR is determined by the slowest clock among the clocks to the circuit 8d, while the falling edge of the clock CLKOR is determined by the signal AD1.

In the arrangement shown in FIG. 6, an inversion signal of the clock CLK may be employed in place of the signal AD1, which makes earlier the timing of the falling of the clock CLKOR.

Figure 7:
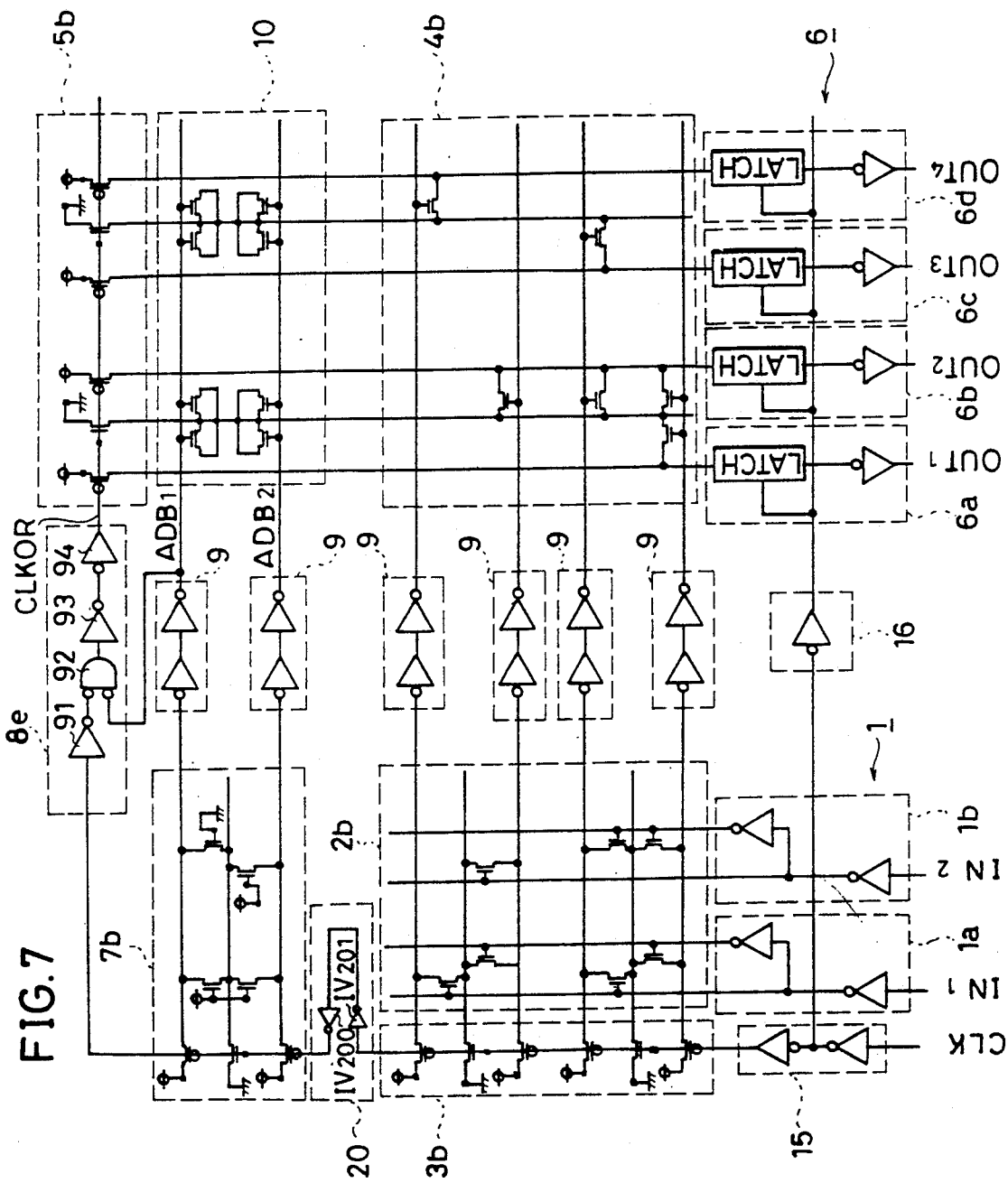
FIG. 7 is a diagram showing constitution of a programmable logic device according to still another embodiment of the invention.

FIG. 7 is a diagram showing constitution of a programmable logic device according to still another embodiment of the invention. In FIG. 7, a buffer circuit 8e comprises an inverter 91 for receiving clock signal from a clock generator 15, a NOR gate 92 for receiving output of the inverter 91 and signal on a dummy logic input signal line ADB1, and inverters 93 and 94 in cascade connection of two stages for receiving output of the NOR gate 92. The precharge control clock signal CLKOR is generated from the inverter 94. Also in the circuit constitution shown in FIG. 7, the drive ability of the inverter 91 is larger than that with which the dummy AND circuit 76 drives of the output signal line. Consequently, the precharge finishing time of the OR-plane is similar to those shown in FIG. 3, FIG. 5 and FIG. 6, but the precharge starting time can be set earlier in comparison with the conventional case, and thereby the high speed operation can be realized.

In this case, as shown in FIG. 7, the precharge clock of the precharge circuit 3b for precharging the AND-plane 2b may be transmitted through a delay circuit 20 for the precharge of the dummy AND circuit 7b. The delay circuit 20 comprises inverter buffers IV200 and IV201 in cascade connection of two stages. Also in this constitution, since the output drive ability of the delay circuit 20 and the inverter 91 is larger than that with which the dummy AND circuit 76 drives the output signal line, its signal change is rapid in comparison with the output signal line of the dummy AND circuit 7b, and thereby the precharge start timing in the OR-plane can be set earlier in comparison with a conventional circuit.

In the buffer circuit 8 in any constitution shown in FIGS. 5 through 7, since the delay due to the logic circuits affecting the clock signal CLK until arriving to the buffer circuit 8 is greater than the delay due to the logic gates affecting the clock signal for controlling the latch operation of the output buffer 6, the secure data detection and the latch operation can be always realized in the output buffer 6 without deteriorating the high speed operation.

Further in the constitution shown in FIG. 7, since the precharge operation of the dummy AND circuit 7b is driven using the delay circuit 20, the precharge finishing operation timing of the precharge circuit 5b can be set later in comparison with the constitution shown in FIG. 3, FIG. 5 and FIG. 6. Consequently, the transition to the signal evaluation state in the OR-plane can be performed after the input signal line potential in the OR-plane is established securely, whereby more secure logic operation can be realized. The delay circuit 20 may be provided on a signal line between the dummy circuit 7b and the buffer circuit 8e, or between the circuit 7b and the buffer circuit 9 for the output ADB1, which arrangement provides larger operating margin.

In the above-mentioned embodiment, although an example has been described in which both the AND-plane and the OR-plane constitute the NOR circuit, similar effect to the embodiment can be obtained also in constitution of synchronous type logic circuitry by other combination such as the NOR circuit and the NAND circuit.

According to the invention as above described, two output signal lines of the AND-plane and the OR-plane are grouped as a pair, and one reference potential signal line is arranged commonly to the two output signal lines in the pair. Thereby the signal wiring occupation area can be reduced, and a programmable logic device suitable for high integration can be obtained.

Further according to the invention, clock signals for controlling the OR-plane precharge are generated in response to the signal potential on the input signal line of the dummy AND circuit and clock signal from the clock generator for controlling the the AND-plane precharge. Thereby the precharge/evaluation operation of the OR-plane can be controlled always at the optimum timing irrespective of the input number, the output number and the product term line number of the programmable logic device as well as the program (presence/absence of lattice point transistor), and the programmable logic device can be obtained where the erroneous operation is not produced and the DC penetrating current is not produced in the output buffer and the high speed operation can be performed.

Further the clock signal for controlling the latch operation of the output buffer and the clock signal for precharging the AND-plane are formed using clock signals from the same clock generator, and the delay time of the clock signal for controlling the latch operation of the output buffer is set smaller than the delay time of the clock signal for the precharge in the OR-plane. Thereby even at a high speed operation, the latch operation in the output buffer can be controlled always without producing the erroneous operation, and the timing design of clock signals can be facilitated.

Further a dummy AND circuit is installed and the discharge speed of the output signal line of the dummy AND circuit is set equal to or longer than the slowest discharge speed of the product term lines in the AND-plane, and the clock signal for precharging the OR-plane is created using the output signal of the dummy AND circuit. Since the delay time of the clock signal for precharging the OR-plane is always set to the optimum value by automatically increasing or decreasing the delay time with respect to the scale of the logic device (such as the number of inputs, the number of outputs and the product term number), the high speed logic operation can be realized. Further in the design of the logic device, the invention can be effectively implemented in a PLA module generator for the automatic generation of the whole logic device in which leaf cells (transistors) corresponding to assigned parameters are arranged at the lattice points of the AND-plane and the OR-plane in accordance with the assigned parameters of the input number, the output number, the logic content and the like.

Further, since the clock signal for controlling the precharge of the OR-plane is generated in response to input signal of the dummy OR circuit and clock signal from the clock generator, the precharge timing in the OR-plane can be made earlier even if the external clock is supplied at the same timing, whereby the logic device with higher speed operation can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A logic device wherein a predetermined logic operation processing is applied to a plurality of externally applied input signals and the processed signals are outputted, comprising:
a first operation logic circuit (2b) having a plurality of first input lines (B1, B1, B2, B2) for transmitting said plurality of input signals, a plurality of first output lines (A1, A2, A3, A4) arranged in the direction intersecting said first input lines, and a plurality of first transistor elements (T21-T27) arranged selectively at the intersections between the first input lines and the first output lines for setting the potential of respective ones of said first output lines either to a first reference potential or to a second reference potential in response to the potential on a respective first input line;
a first dummy operation circuit (7b, 7c, 7d) having a first dummy output line (AD1) to which are connected as many transistor elements as the first transistor elements potentially connectable to one of the first output lines for performing a dummy logic operation similar to that of said first operation logic circuit;
means (15) for generating a first clock signal in response to an external clock signal;
first precharge means (PT71, PT72; PT201-PT204) for precharging the first output lines and the first dummy output line to the first reference potential in response to the first clock signal;
a second operation logic circuit having a plurality of second input lines (AB1-AB4) provided corresponding to said first output lines, a plurality of second output lines (01-04) arranged in the direction intersecting said second input lines, and a plurality of second transistor elements (T41-T46) arranged selectively at the intersections between the second input lines and the second output lines and each for setting an associated output line to either the first reference potential or the second reference potential in response to the signal potential on an associated second input line;
a second dummy operation circuit (10) provided corresponding to the first dummy output line and having a first dummy input line (ADB1) to which is connected at least the maximum load capacitance potentially associatable with respective said second input lines;
dummy input line drive means (9) for performing a buffer processing on the signal potential of the first dummy output line and transmitting thus processed potential to the first dummy input line;
input line drive means (9) provided between the first output lines and the second input lines for performing a buffer processing on the signal potential of the first output lines and transmitting thus processed potential to the second input lines;
means (8c; 8d; 8e) for generating a second clock signal in response to at least the first clock signal and output of said dummy input line drive means; and
second precharge means (5b) for precharging the second output lines to the first reference potential in response to the second clock signal.

2. A logic device as set forth in claim 1, wherein said first clock generating means comprises first inverting means (IV15) for inverting the external clock signal, and second inverting means (IV16) for inverting output of said first inverting means and generating the first clock signal; and
said second clock generating means comprises a logic gate (81) for receiving output of said first inverting means and a signal on the first dummy input line (ADB1) and generating a logic true signal only when both received signals are logic false, and delay means for delaying the logic gate output and generating the second clock signal, said second precharge means being activated when the delay means output is logic true.

3. A logic device as set forth in claim 1, wherein said first dummy operation circuit comprises a second dummy output line (AD2) constituting a pair with said first dummy output line, and a second dummy input line (ADB2) constituting a pair with said first dummy input line; and
said second clock signal generating means comprises a logic gate (15) for receiving the signal potential on the first dummy output line, the signal potential on the first dummy input lien and the signal potential on the dummy input line and outputting a logic true signal only when all received potentials are logic false, and delay means for delaying the logic gate output and generating the second clock signal, said second precharge means being activated when the delay means output is logic true.

4. A logic device as set forth in claim 1, wherein said second clock signal generating comprises first delay means (91) for inverting and delaying the first clock signal, a logic gate (92) for receiving the first delay means output and the signal potential on said dummy input line and outputting a logic true signal only when both received signals are logic false, and second delay means (93, 94) for delaying the logic gate output and generating the second clock signal, said second precharge means being activated when the second delay means output is logic true.

5. A logic device as set forth in claim 1, wherein said first precharge means comprises a first precharge circuit (3b) for precharging the first output lines, and a second precharge circuit (NT71, PT71, PT72) for precharging the first dummy output line; and
said logic device further comprises means for delaying the first clock signal supplied to the first precharge circuit by a prescribed time and transferring the delayed signal to said second precharge circuit.

6. A logic device as set forth in claim 1, wherein said first operation logic circuit further comprises a plurality of first potential supply lines (CD1, CD2) each transmitting the second reference potential (Vss);
said second operation logic circuit further comprises second potential supply lines (CD3, CD4) each transmitting the second reference potential;
said first output lines are grouped each two lines as a pair, and each of the first potential supply line is provided commonly to the two first output lines in a pair, and said first transistor element selectively couples associated first output line with associated first potential supply line in response to supplied input signal;
said second output lines are grouped each two lines as a pair, and the second potential supply line is provided commonly to the two second output lines in a pair, and each of the second transistor elements selectively couples associated second output line with associated second potential supply line in response to the signal potential on associated second input line;

said first precharge means comprises means (NT201, NT202) for separating the first potential supply line from a supply source of the second reference potential in response to the first clock signal during the precharge operation of the first output lines to the first reference potential; and said second precharge means comprises means (NT501, NT502) for separating the second potential supply line from the supply source of the second reference potential in response to the second clock signal during the precharge operation of the second output lines to the first reference potential.

7. A logic device as set forth in claim 1, further comprising:

means (16) for delaying the external clock signal by a prescribed time and generating a third clock signal, the delay time of the third clock signal being set less than the delay time of the second clock signal to the external clock signal; and means (L1-L4) for latching the signal potential as an output signal on the second output lines in response to the third clock signal, said latching means allowing the signal potential on said second output lines to pass as it is when the third clock signal is logic true and latching signal potential on said second output lines when the third clock signal is logic false.

8. A logic device wherein a predetermined logic operation processing is applied to a plurality of input signals and the processed signals are outputted, comprising:

a first operation logic circuit (2b) having a plurality of first input lines (B1, B1, B2, B2) for transmitting the plurality of input signals, a plurality of first output lines (A1-A4) arranged in the direction intersecting said first input lines, a plurality of first potential supply lines (CD1, CD2) for transmitting a first reference potential (Vss), and a plurality of first transistor elements (T21-T27) arranged selectively at the intersections between the first input lines and the first output lines and each for connecting associated first output line to said first potential line selectively in response to the signal potential on associated first input line;

a first dummy operation logic circuit (7b) having dummy logic output lines (AD1, AD2), second potential supply lines (CD10) for transmitting the first reference potential, and second transistor elements (T701-T704) arranged between said dummy logic output lines and said second potential supply lines and having the same number of transistor elements as the maximum number of transistor elements potentially connectable to said first output lines;

circuit means (15) for generating a first clock signal in response to an external clock signal;

first precharge circuit means (3b, PT71, PT72) for precharging the first output lines and the dummy logic output lines to the second reference potential (Vcc) in response to the first clock signal;

a second operation circuit (4b) having second input lines (AB1-AB4) provided corresponding to said first output lines for receiving the signal potential on the corresponding first output lines, a plurality of second output lines (01-04) arranged in the direction intersecting said second input lines, third potential supply lines (CD3, CD4) for transmitting the first reference potential, and a plurality of third transistor elements (T41-T46) arranged selectively at the intersections between the second input lines and the second output lines for connecting associated second output line selectively to associated third reference potential supply line;

a second dummy operation circuit (10) having dummy input lines (ADB1, ADB2) for receiving the signal potential on said dummy logic lines transmitted thereto, said dummy input lines with the load capacitance being at least the same as the load capacitance supplied by the maximum number of the third transistor elements potentially connectable to the second input liens;

circuit means (8b, 8c, 8d) for generating a second clock signal in response to at least the signal potential on the dummy input lines; and second precharge circuit means (5b) for precharging the second output lines to the second reference potential in response to the second clock signal;

said first output lines being grouped each two lines as a pair, and each said first potential supply line being provided commonly to the two first output lines in a pair;

said second output lines being grouped each two lines as a pair, and said third potential supply line being provided commonly to the two second output lines in a pair;

said dummy logic output lines comprising a first dummy logic output line (AD1) for generating a signal to derive the second clock signal, and a second dummy logic output line (AD2) constituting a pair with the first dummy logic output line;

said second transistor elements (T701, T703; T711, T712; T751, T752), which are connected to said first dummy logic output line having the same number of the transistor elements potentially connectable to the first output lines, only one of these second transistors being normally turned on and all remaining those second transistors being normally turned off, and said second transistor elements (T702, T704; T753, T754) which are connected to said second dummy logic output line having the same number as that of the second transistors connected to the first dummy logic output lines, all these second transistors being normally turned on; and said first and second precharge means comprising means (NT201, NT202, NT71, NT501, NT502) for separating said first through third potential supply lines from a supply source of said first potential during the precharge operation of the first output lines, the second output lines and the dummy logic output lines to the second reference potential.

9. A logic device as set forth in claim 8, wherein said first clock generating means comprises first inverting means (IV15) for inverting the externally applied clock signal, and second inverting means (IV16) for inverting output of said first inverting means and generating the first clock signal; and said second clock generating means comprises a logic gate ADB1(81) for receiving output of said first inverting means and a signal on the first dummy input line (ADB1) and generating a logic true signal only when both received signals are logic false, and delay means for delaying the logic gate output and generating the second clock signal, said second precharge means being activated when the delay means output is logic true.

10. A logic device as set forth in claim 8, wherein said dummy input lines comprise a pair of first and second dummy input lines (ADB1, ADB2) corresponding to said first and second dummy logic lines; and said second clock signal generating means comprises a logic gate for receiving a signal potential on the first dummy output line, the signal potential on the first dummy input line and the signal potential on the dummy input line and outputting a logic true signal only when all received potentials are logic false, and delay mans for delaying the logic gate output and generating the second clock signal, said second precharge means being activated when the delay means output is logic true.

11. A logic device as set forth in claim 8, wherein said dummy input lines comprise a pair of first and second dummy input lines (ADB1, ADB2) corresponding to said first and second dummy logic output lines; and said second clock signal generating means comprises first delay mans (91) for inverting and delaying the first clock signal, a logic gate (92) for receiving the first delay means output and the signal potential on said dummy input line and outputting a logic true signal only when both received signals are logic false, and second delay means (93, 94) for delaying the logic gate output and generating the second clock signal, said second precharge means begin activated when the second delay means output is logic true.

12. A logic device a set forth in claim 8, wherein said first precharge means comprises a first precharge circuit (3b) for precharging the first output lines, and a second precharge circuit (NT71, PT71, PT72) for precharging the dummy logic lines; and said logic device further comprises means for delaying the first clock signal supplied to the first precharge circuit by a prescribed time and transferring the delayed signal to said second precharge circuit.

13. A logic device as set forth in claim 8, further comprising:

means (16) for delaying the external clock signal by a prescribed time and generating a third clock signal, the delay time undergone by the third clock signal being set less than the delay time of the second clock signal to the external clock signal; and means (L1-L4) for latching signal potential as an output signal on the second output lines in response to the third clock signal, said latching means allowing the signal potential on each said second output line to pass as it is when the third clock signal is logic true and latching the signal potential on each said second output line when the third clock signal is logic false.

14. A logic device wherein a predetermined logic operation processing is applied to a plurality of input signals and the processed signals are outputted, comprising:

first logic operation circuit means (2b) having a plurality of first input signal lines (B1, B1, B2, B2) for receiving the plurality of input signals, a plurality of first output signal lines (A1-A4) arranged in the direction intersecting said first input signal lines, and a plurality of first transistor elements (T21-T27) arranged selectively at the intersections between the plurality of first input lines and the plurality of second output lines for transmitting a first reference potential selectively onto associated first output signal lines in response to the signal potential on associated first input signal lines;

means (15) for generating a first clock signal in response to an external clock signal;

first precharge means (3b) for precharging the first output signal lines to the second reference potential in response to the first clock signal;

second logic operation circuit means (4b) having a plurality of second input signal lines (Ab1-Ab4) provided corresponding to the plurality of first output signal lines and receiving signals on the corresponding first output signal lines, a plurality of second output signal lines (01-04) arranged in the direction intersecting said second input lines, and a plurality of second transistor elements (T41-T44) arranged selectively at the intersections between the second signal lines and the second output signal lines and each for transmitting the first reference potential selectively to an associated second output signal line in response to the signal potential on an associated second input line;

first clock delay means (7b, 8b, 9; 7c, 8c, 9; 7d, 8d, 9; 20, 8e) for delaying the first clock signal by the first delay time and transmitting the delayed signal;

second precharge means (5b) for precharging the second output signal lines to a second reference potential in response to the delayed clock signal from the first clock delay means;

second clock delay means (16) for delaying the first clock signal by a second delay time less than the first delay time and transmitting the delayed signal; and means (L1-L4) for latching the signal potential on the plurality of second output signal lines in response to the delayed clock signal from said second clock delay means, the delayed clock signal from said second delay means and the clock signal being in phase, and said latch means executing the latch operation before the precharge start by said second precharge means.

15. A logic device as set forth in claim 14, further comprising:

a first dummy operation circuit (7b; 7c; 7d) having a first dummy output line (AD1) to which are connected as many transistor elements as the first transistor elements potentially connectable to the first output signal lines for performing falsely logic operation similar to that of said first operation logic circuit means;

a second dummy operation circuit (10) having a first dummy input line (ADB1) provided corresponding to the first dummy output line, and having connected thereto at least the maximum load capacitance potentially associatable with the respective second input signal lines;

dummy input line drive means (9) for performing the buffer processing of the potential of the first dummy output lines and transmitting the processed potential to the first dummy input lines;

input line drive means (9) provided between the first output signal lines and the second input signal lines for performing a buffer processing of the potential of the first output signal lines and transmitting the processed potential to the second input lines;

means (8c; 8d; 8e) for generating a second clock signal in response to at least the first clock signal from said clock signal generating means and output of said dummy input line drive means; and second precharge means (5b) for precharging the second output signal lines to the first reference potential in response to the second clock signal.

16. A logic device as set forth in claim 15, wherein said first clock signal generating means comprises first inverting mans (IV15) for inverting the external clock signal, and second inverting means (IV16) for inverting output of said first inverting means and generating the first clock signal; and said second clock signal generating means comprises a logic gate (81) for receiving output of said first inverting means and a signal on the first dummy output line (ADB1) and generating a logic true signal only when both received signals are logic false, and delay means (82, 83) for delaying the logic gate output and generating the second clock signal, said second precharge means being activated when the delay means output is logic true.

17. A logic device as set forth in claim 15, wherein said first dummy operation circuit comprises a second dummy output line (AD2) constituting a pair with said first dummy output line, and a second dummy input line (ADB2) constituting a pair with said first dummy input line; and said second clock signal generating means comprises a logic gate (15) for receiving the signal potential on the first dummy output line, the signal potential on the first dummy input line and the signal potential on the second dummy input line and outputting a logic true signal only when all received potentials are logic false, and delay means (86, 87) for delaying the logic gate output and generating the second clock signals, said second precharge means begin activated when the delay means output is logic true.

18. A logic device as set forth in claim 15, wherein said second clock signal generating means comprises first delay means (91) for inverting and delaying the first clock signal, a logic gate (92) for receiving the first delay means output and the signal potential on said first dummy input line and outputting a logic true signal only when both received signals are logic false, and second delay means ADB1(93, 94) for delaying the logic gate output and generating the second clock signal, said second precharge means being activated when the second delay means output is logic true.

19. A logic device s set forth in claim 15, wherein said first precharge means comprises a first precharge circuit (3b) for precharging the first output lines, and a second precharge circuit (NT71, PT71, PT72) for precharging the first dummy output lines; and said logic device further comprises means for delaying the first clock signal supplied to the first precharge circuit by a prescribed time and transferring the delayed signal to said second precharge circuit.

20. A logic device as set forth in claim 14, wherein said first operation logic circuit further comprises a plurality of first potential supply lines (CD1, CD2) each transmitting the second reference potential (Vss);

said second operation logic circuit further comprises second potential supply lines (CD3, CD4) each transmitting the second reference potential;

said first output signal lines are grouped each two lines as a pair, and each of the first potential supply line is provided commonly to the two first output signal lines in a pair, and said first transistor selectively couples associated first output line with associated first potential supply line in response to a supplied input signal;

said second output signal lines are grouped each two lines as a pair, and the second potential supply line is provided commonly to the two second output signal lines in a pair, and each of the second transistors selectively couples an associated second output signal line with an associated second potential supply line in response to the signal potential on an associated second input signal line;

said first precharge means comprises means (NT201, NT202) for separating the first potential supply line from a supply source of the second reference potential in response to the first clock signal during the precharge operation of the first output signal lines to the first reference potential; and said second precharge means comprises means (NT501, NY502) for separating the second potential supply line from the supply source of the second reference potential in response to the second clock signal during the precharge operation of the second output lines to the first reference potential.

21. Driving method of a programmable logic device having first input lines (B1, B1, B2, B2) to which input signals are transmitted, product term lines (A1-A4) to which signals on the first input lines are transmitted in accordance with first pattern previously programmed, first dummy output lines (AD1, AD2), first dummy input lines (ADB1, ADB2), second input lines to which signals of the product term lines are transmitted, and sum term lines (01-01) to which signals of the processing result on the second signal lines in accordance with second pattern previously programmed are transmitted, said method comprising the steps of:

transmitting input signals to be processed to said first input signal lines;

step of generating a first clock signal in response to an externally applied clock signal;

finishing the precharge of said product term lines to a prescribed potential in response to the first clock signal and asserting the signals on the product term lines from the potential of the input lines in accordance with the first pattern and changing potential of said first dummy output lines at a speed less than the lowest potential change speed of said product term lines;

performing a buffer processing of the potential of said first dummy output lines and said product term lines and transmitting the processed potential to said first dummy input lines and said second input lines, the potential change speed of said first dummy input lines being less than the lowest speed of charge/discharge of said second input lines; and generating a second clock signal at least in response to the signals of said first dummy input lines and the first clock signal and finishing the precharge of said sum term lines to the prescribed potential and asserting the signal potentials of said sum term lines to the signal potentials attained by processing the signals of the second input lines in accordance with second pattern.

22. Method as set forth in claim 21, further comprising the steps of:

delaying the external clock signal by a predetermined period and generating a third clock signal, said third clock signal being generated at earlier timing in comparison to the second clock signal; and releasing the latch of the signal potential of said sum term lines in response to the third clock signal and deriving the output signals, said latch being activated in response to the third clock signal before the precharge of the sum term lines due to the activation of the second clock signal.

23. Driving method of a programmable logic device having first input lines (B1, B1, B2, B2) to which input signals are transmitted, product term lines (A1-A4) to which signals of a first input lines are transmitted in accordance with the first pattern previously programmed, second input lines to which signals of the product term lines are transmitted, and sum term lines (01-04) to which signals of the processing result on the second signal lines in accordance with a second pattern previously programmed are transmitted, said method comprising the steps of:

transmitting input signals to be processed to said first input signal lines;

generating a first clock signal in response to an externally applied clock signal;

delaying the external clock signal by a prescribed period and generating a second clock signal in phase with the external clock signal;

finishing the precharge of said product term lines to a prescribed potential in response to the first clock signal and asserting the signal potential on the product term lines in response to the potential of the input lines and in accordance with the first pattern; generating a third clock signal at a later timing than that of the second clock signal, in response to the first clock signal;

performing a buffer processing on the signal potential on said product term lines and transmitting the processed potential to said first input lines;

finishing the precharge of the sum term lines to a prescribed potential in response to the third clock signal and asserting the signal potential of said sum term lines in response to the processed signal potential on the second input lines in accordance with the second pattern; and releasing the latch of the signal potential of said sum term lines in response to the second clock signal and deriving output signals, said latch being activated in response to the clock signal before the precharging of the sum term lines in response to the activation of the third clock signal.

24. Method as set forth in claim 23, wherein said programmable logic device further comprises first dummy output lines (AD1, AD2), and first dummy input lines (ADB1, ADB2), and wherein said step of generating the third clock signal comprises the steps of:

causing the potential change of said first dummy output lines at a speed less than the lowest charge/discharge speed of the product term lines in response to the first clock signal;

performing a buffer processing on the signal potential of said first dummy output lines and transmitting the processed potential to said dummy input lines, and causing the potential change of said first dummy input lines at a speed less than the lowest charge/discharge speed of said sum term lines; and generating the third clock signal at least in response to the first clock signal and the signal potential on said first input lines.

* * * * *

UNITED STATES PATENT AND TRADEMARK OFFICE
CERTIFICATE OF CORRECTION

PATENT NO. : 5,101,122
DATED : March 31, 1992
INVENTOR(S) : Hirofumi SHINOHARA

It is certified that error appears in the above-identified patent and that said Letters Patent is hereby corrected as shown below:

On the title page:

Please correct the spelling of the inventor's name as follows:

[75] Inventor: Hirofumi [Shinonhara] Shinohara, Hyogo, Japan

Signed and Sealed this

Twenty-ninth Day of June, 1993

Attest:

MICHAEL K. KIRK

*Attesting Officer*      *Acting Commissioner of Patents and Trademarks*